United States Patent
Hasegawa

(10) Patent No.: US 10,854,688 B2
(45) Date of Patent: Dec. 1, 2020

(54) DISPLAY PANEL AND ELECTRONIC APPARATUS

(71) Applicant: JOLED Inc., Tokyo (JP)

(72) Inventor: Eiji Hasegawa, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 16/734,425

(22) Filed: Jan. 6, 2020

(65) Prior Publication Data

US 2020/0235175 A1    Jul. 23, 2020

(30) Foreign Application Priority Data

Jan. 17, 2019  (JP) ................................ 2019-005922

(51) Int. Cl.
*H01L 27/32*    (2006.01)

(52) U.S. Cl.
CPC ...... *H01L 27/3223* (2013.01); *H01L 27/3258* (2013.01); *H01L 27/3276* (2013.01)

(58) Field of Classification Search
CPC ............. H01L 27/3223; H01L 27/3258; H01L 27/3276

See application file for complete search history.

(56) References Cited

U.S. PATENT DOCUMENTS

2019/0081125 A1* 3/2019 Murai ............... H01L 29/41733

FOREIGN PATENT DOCUMENTS

JP   2009-110865 A    5/2009

* cited by examiner

*Primary Examiner* — Anthony Ho
(74) *Attorney, Agent, or Firm* — Xsensus LLP

(57) ABSTRACT

A display panel includes a planarization layer, self-luminous elements, a first wiring line, a second wiring line, and a sensing wiring line. The first wiring line is coupled to the first electrode layer through a first opening of the planarization layer. The second wiring line is coupled to the second electrode layer through a second opening of the planarization layer. The sensing wiring line is provided in a region and is electrically separated from the first electrode layer, the second electrode layer, the first wiring line, and the second wiring line. The region is positioned in the same layer as the first electrode layer, in the same layer as the second wiring line, or in a layer disposed between the first electrode layer and the second wiring line, and is positioned between the first electrode layer and the second opening.

10 Claims, 14 Drawing Sheets

DISPLAY PANEL AND ELECTRONIC APPARATUS

CROSS REFERENCE TO RELATED APPLICATIONS

This application claims the benefit of Japanese Priority Patent Application JP2019-005922 filed Jan. 17, 2019, the entire contents of which are incorporated herein by reference.

BACKGROUND

The disclosure relates to a display panel and an electronic apparatus.

A display panel that includes a self-luminous element, such as an organic electro-luminescence (EL) element, can suffer from entry of moisture from a bezel region of the display panel. The entry of moisture can cause a deterioration in the self-luminous element, which in turn can lead to a decrease in luminance of light emitted from the self-luminous element, or can lead to an unstable emission of light.

The entry of moisture from the bezel region of the display panel to the self-luminous element often takes several hundreds of hours to several thousands of hours, meaning that it is extremely difficult to detect a display defect prior to shipment of the display panel, and that there is a concern of an occurrence of the display defect after the shipment.

To address such concerns, a proposal has been made to provide a display panel with a mechanism that senses the moisture that enters from the bezel region of the display panel to thereby detect the display panel that can cause the display defect after the shipment. For example, reference is made to Japanese Unexamined Patent Application Publication No. 2009-110865.

SUMMARY

A display panel according to one embodiment of the disclosure includes a planarization layer, a plurality of self-luminous elements, a first wiring line, a second wiring line, and a sensing wiring line. The planarization layer has a first opening and a second opening that is provided closer to an end edge of the display panel than the first opening. The plurality of self-luminous elements is provided on a front surface of the planarization layer, and each includes a first electrode layer, a light-emitting layer, and a second electrode layer that are provided in this order from the planarization layer. The first wiring line is provided on a back surface of the planarization layer, and coupled to the first electrode layer through the first opening. The second wiring line is provided on the back surface of the planarization layer, and coupled to the second electrode layer through the second opening. The sensing wiring line is provided in a region and electrically separated from the first electrode layer, the second electrode layer, the first wiring line, and the second wiring line. The region is positioned in the same layer as the first electrode layer, in the same layer as the second wiring line, or in a layer disposed between the first electrode layer and the second wiring line, and is positioned between the first electrode layer and the second opening.

An electronic apparatus according to one embodiment of the disclosure is provided with a display surface that includes a display panel. The display panel includes a planarization layer, a plurality of self-luminous elements, a first wiring line, a second wiring line, and a sensing wiring line. The planarization layer has a first opening and a second opening that is provided closer to an end edge of the display panel than the first opening. The plurality of self-luminous elements is provided on a front surface of the planarization layer, and each includes a first electrode layer, a light-emitting layer, and a second electrode layer that are provided in this order from the planarization layer. The first wiring line is provided on a back surface of the planarization layer, and coupled to the first electrode layer through the first opening. The second wiring line is provided on the back surface of the planarization layer, and coupled to the second electrode layer through the second opening. The sensing wiring line is provided in a region and electrically separated from the first electrode layer, the second electrode layer, the first wiring line, and the second wiring line. The region is positioned in the same layer as the first electrode layer, in the same layer as the second wiring line, or in a layer disposed between the first electrode layer and the second wiring line, and is positioned between the first electrode layer and the second opening.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
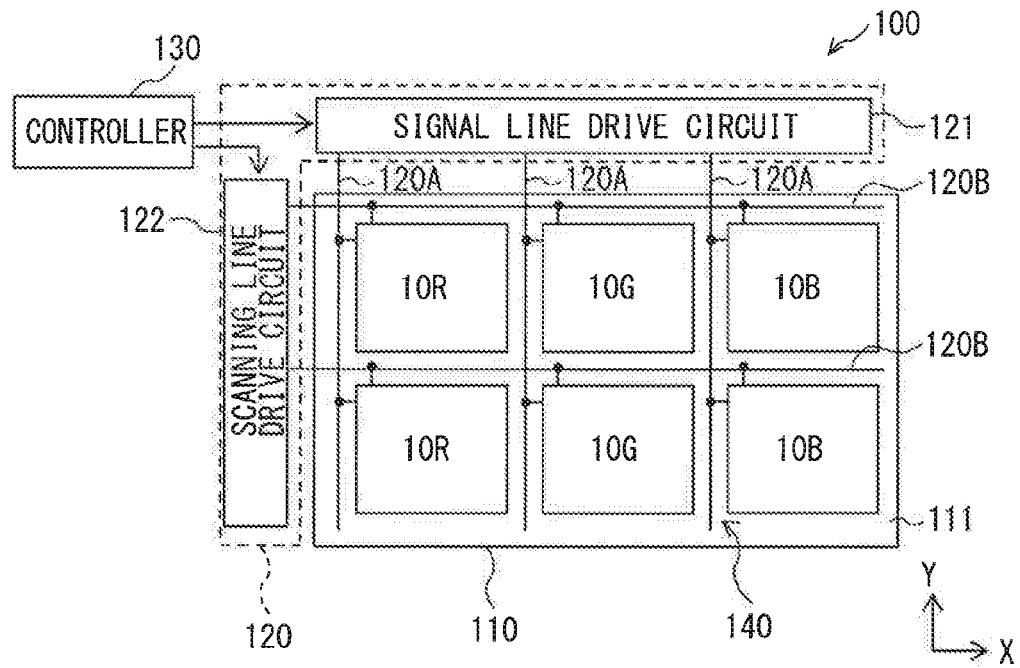
FIG. 1 is a diagram illustrating an example of a configuration of a display unit according to one example embodiment of the disclosure.

A technique disclosed in Japanese Unexamined Patent Application Publication No. 2009-110865 has a concern in which a mechanism may possibly sense a moisture even in a case where an occurrence of a display defect is practically unlikely.

It is desirable to provide a display panel that makes it possible to detect, with improved accuracy, the display panel that can cause a display defect attributed to entry of moisture from a bezel region, and an electronic apparatus that includes the display panel.

In the following, some example embodiments of the technology will be described in detail with reference to the drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail. The description will be given in the following order.
1. Outline of Some Example Embodiments
2. Example Embodiment (display unit)
3. Modification Examples (display unit)
4. Application Examples (electronic apparatus)

1. OUTLINE OF SOME EXAMPLE EMBODIMENTS

A display panel according to one embodiment of the disclosure includes a planarization layer, a plurality of self-luminous elements, a first wiring line, a second wiring line, and at least one sensing wiring line. The planarization layer has a first opening and a second opening that is provided closer to an end edge than the first opening. The plurality of self-luminous elements is provided on a front surface of the planarization layer, and each includes a first electrode layer, a light-emitting layer, and a second electrode layer that are provided in this order from the planarization layer. The first wiring line is provided on a back surface of the planarization layer, and coupled to the first electrode layer through the first opening. The second wiring line is provided on the back surface of the planarization layer, and coupled to the second electrode layer through the second opening.

The at least one sensing wiring line is provided in a region that is positioned in the same layer as the first electrode layer, in the same layer as the second wiring line, or in a layer disposed between the first electrode layer and the second wiring line, and that is positioned between the first electrode layer and the second opening. The at least one sensing wiring line is electrically separated from the first electrode layer, the second electrode layer, the first wiring line, and the second wiring line.

In some embodiments, the at least one sensing wiring line may be provided in the same layer as the first electrode layer. In such embodiments, the at least one sensing wiring line may include the same material as the first electrode layer.

In some embodiments, the display panel may further include: a drive circuit provided on the back surface of the planarization layer and configured to drive the plurality of self-luminous elements; and a protection layer that is provided on the back surface of the planarization layer and covers, entirely or partially, the drive circuit, the first wiring line, and the second wiring line. In such embodiments, the at least one sensing wiring line may be provided between the protection layer and the planarization layer, or may be provided in the same layer as the second wiring line. In some embodiments where the at least one sensing wiring line is provided in the same layer as the second wiring line, the at least one sensing wiring line may include the same material as the second wiring line.

In some embodiments, the at least one sensing wiring line may be configured to vary its resistance value on the basis of a corrosion caused by a moisture. In such embodiments, the at least one sensing wiring line may include a metal material containing aluminum.

In some embodiments, the at least one sensing wiring line may be provided along an outer edge of the display panel.

2. EXAMPLE EMBODIMENT

Configuration

FIG. 1 is a diagram illustrating an example of an overall configuration of a display unit 100 according to an example embodiment of the disclosure. The display unit 100 may include a display panel 110, a driver 120, and a controller 130. The display panel 110 may include a plurality of subpixels 10R, 10G and 10B that is disposed in a matrix pattern. The subpixel 10R may display a red color, the subpixel 10G may display a green color, and the subpixel 10B may display a blue color. The subpixels that are the same in color as each other may be arranged in a line in a Y direction. Further, the red subpixels 10R arranged in a line in the Y direction, the green subpixels 10G arranged in a line in the Y direction, and the blue subpixels 10B arranged in a line in the Y direction may be disposed repeatedly in order in an X direction. Thus, three subpixels including the red subpixel 10R, the green subpixel 10G and the blue subpixel 10B arranged in the X direction may form a pixel, or a display pixel.

The driver 120 may include a signal line drive circuit 121 and a scanning line drive circuit 122 each serving as a driver directed to displaying of an image.

The signal line drive circuit 121 may supply a signal voltage of an image signal to any of the subpixels 10R, 10G and 10B selected by the scanning line drive circuit 122. The image signal may correspond to luminance data, and may be supplied from the controller 130. The scanning line drive circuit 122 may include a shift register or any other device. The shift register may sequentially shift or transfer a start pulse in synchronization with a clock pulse supplied from the controller 130. The scanning line drive circuit 122 may supply a scanning signal to each scanning line 120B sequentially to thereby perform scanning of each of the subpixels 10R, 10G and 10B on a row basis.

Figure 2:
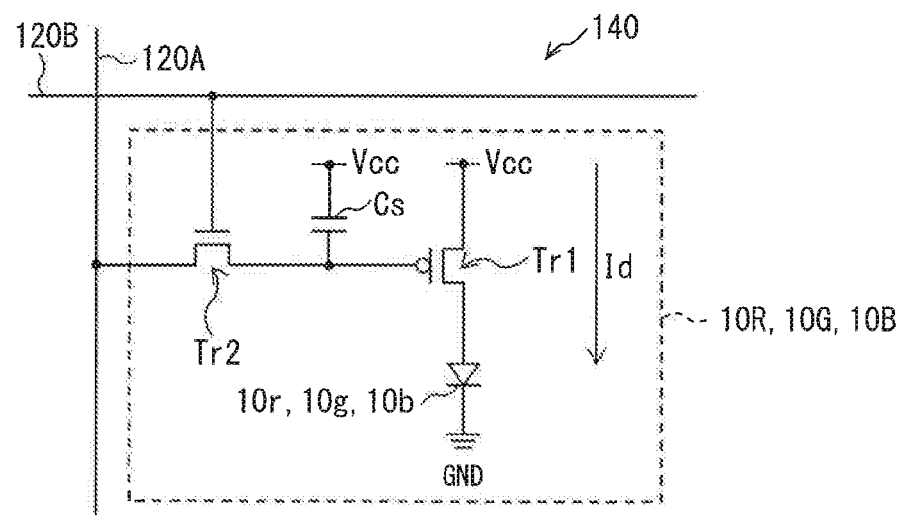
FIG. 2 is a diagram illustrating an example of a pixel drive circuit illustrated in FIG. 1.

The display panel 110 may also include a pixel drive circuit 140. FIG. 2 is a diagram illustrating an example of the pixel drive circuit 140, i.e., an example of a pixel circuit of any of the subpixels 10R, 10G and 10B. The pixel drive circuit 140 may be an active drive circuit. As described later in greater detail, the pixel drive circuit 140 may be provided at a layer disposed below an anode electrode layer 13, e.g., at a later-described pixel drive circuit formation layer 112. In one example, the pixel drive circuit 140 may be provided on a back surface of a planarization layer 218. The pixel drive circuit 140 may include a driving transistor Tr1, a switching transistor Tr2, and a capacitor (a storage capacitor) Cs. The pixel drive circuit 140 may also include an organic EL element 10r, an organic EL element 10g, or an organic EL element 10b provided between a power line Vcc and a power line GND and coupled in series to the driving transistor Tr1. The organic EL element 10r may emit red light, the organic EL element 10g may emit green light, and the organic EL element 10b may emit blue light. In the following description, the organic EL element 10r, the organic EL element 10g, and the organic EL element 10b are collectively referred to as an organic EL element 10. The driving transistor Tr1 and the switching transistor Tr2 each may be a thin-film transistor (TFT). The driving transistor Tr1 and the switching transistor Tr2 each may be a general TFT. A configuration of each of the driving transistor Tr1 and the switching transistor Tr2 is not particularly limited. For example, the driving transistor Tr1 and the switching transistor Tr2 each may have an inverted staggered structure (a so-called bottom gate structure) or may have a staggered structure (a so-called top gate structure).

The pixel drive circuit 140 may include a plurality of signal lines 120A extending in a column direction, and a plurality of scanning lines 120B extending in a row direction. Any of the subpixels 10R, 10G, and 10B may be provided at an intersection of any of the signal lines 120A and any of the scanning lines 120B. The signal lines 120A each may be coupled to the signal line drive circuit 121. The signal line drive circuit 121 may supply an image signal to a source electrode of the switching transistor Tr2 through corresponding one of the signal lines 120A. The scanning lines 120B each may be coupled to the scanning line drive circuit 122. The scanning line drive circuit 122 may supply a scanning signal to a gate electrode of the switching transistor Tr2 through corresponding one of the scanning lines 120B.

[Example of Planar Configuration of Display Panel 110]

Figure 3:
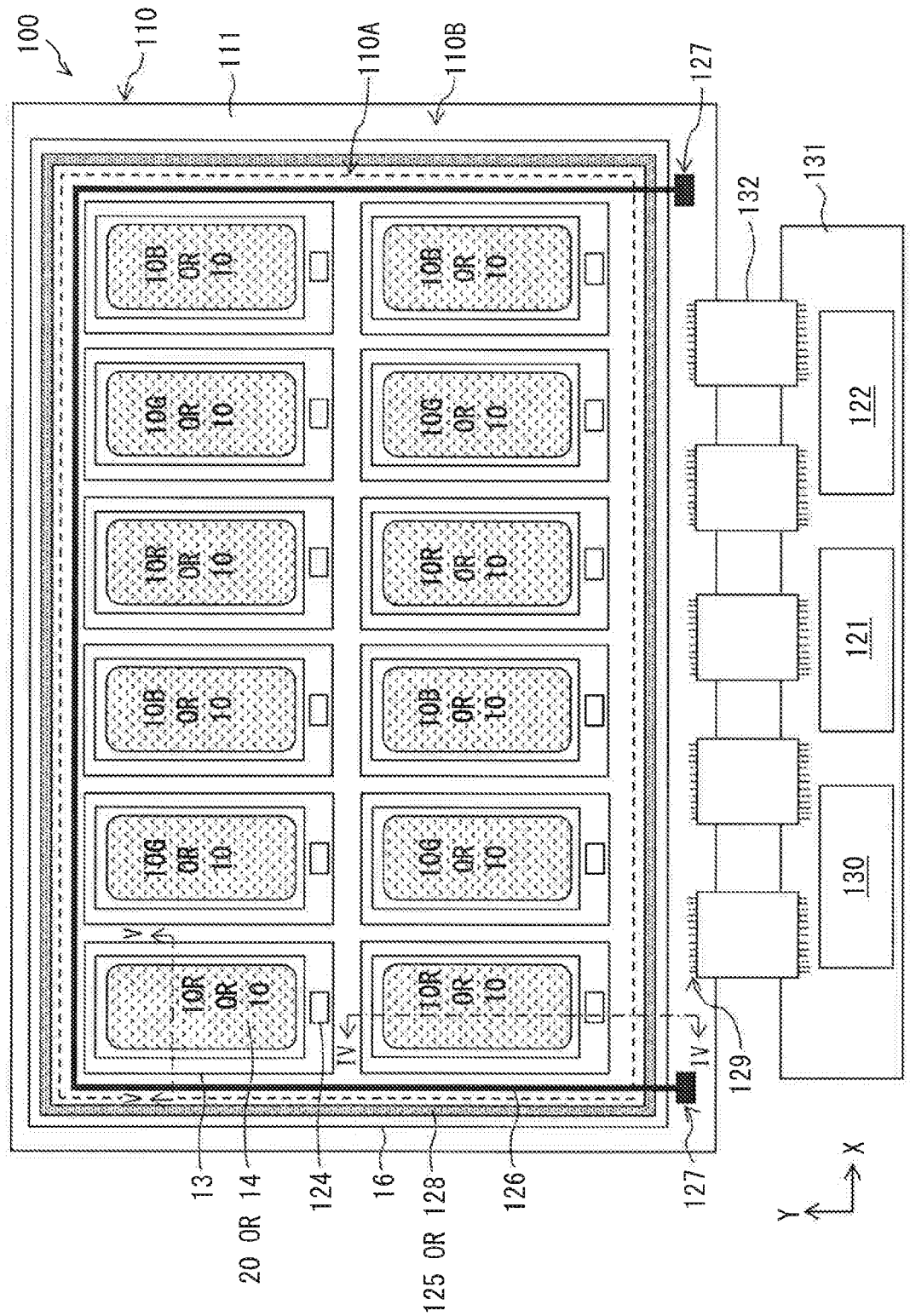
FIG. 3 is a diagram illustrating an example of a planar configuration of a display region illustrated in FIG. 1.

FIG. 3 is a diagram illustrating an example of a planar configuration of the display panel 110. FIG. 3 schematically illustrates the planar configuration in which a cathode electrode layer 16, an inorganic insulation layer 17, an organic insulation layer 18, and an inorganic insulation layer 19, which are described later in greater detail, are removed. The inorganic insulation layer 17 and the inorganic insulation layer 19 each may correspond to a specific but non-limiting example of a "protection layer" according to one embodiment of the disclosure. Referring to FIG. 3, a display region 110A may include the organic EL elements 10 that are arranged in the X direction and the Y direction, i.e., arranged in matrix as a whole. Light-emission sections 20 may be provided for the respective subpixels 10R, 10G, and 10B on a one-by-one basis. The plurality of light-emission sections 20 is separated from one another by a later-described aperture-defining insulation film 24 illustrated in FIG. 4. The aperture-defining insulation film 24 may define a contour of each of the light-emission sections 20.

The display panel 110 may have a peripheral region whose one side may be provided with a plurality of mounting terminals 129. The mounting terminals 129 may be electrically coupled to the subpixels 10 and a flexible printed circuit (FPC) 132. The controller 130 and the driver 120 may be mounted on a control board 131, and may be electrically coupled to the display panel 110 (or to the subpixels 10) through the FPC 132. The controller 130 and the driver 120 may drive the display panel 110 (or the subpixels 10) on the basis of the image signal supplied from outside.

Figure 4:
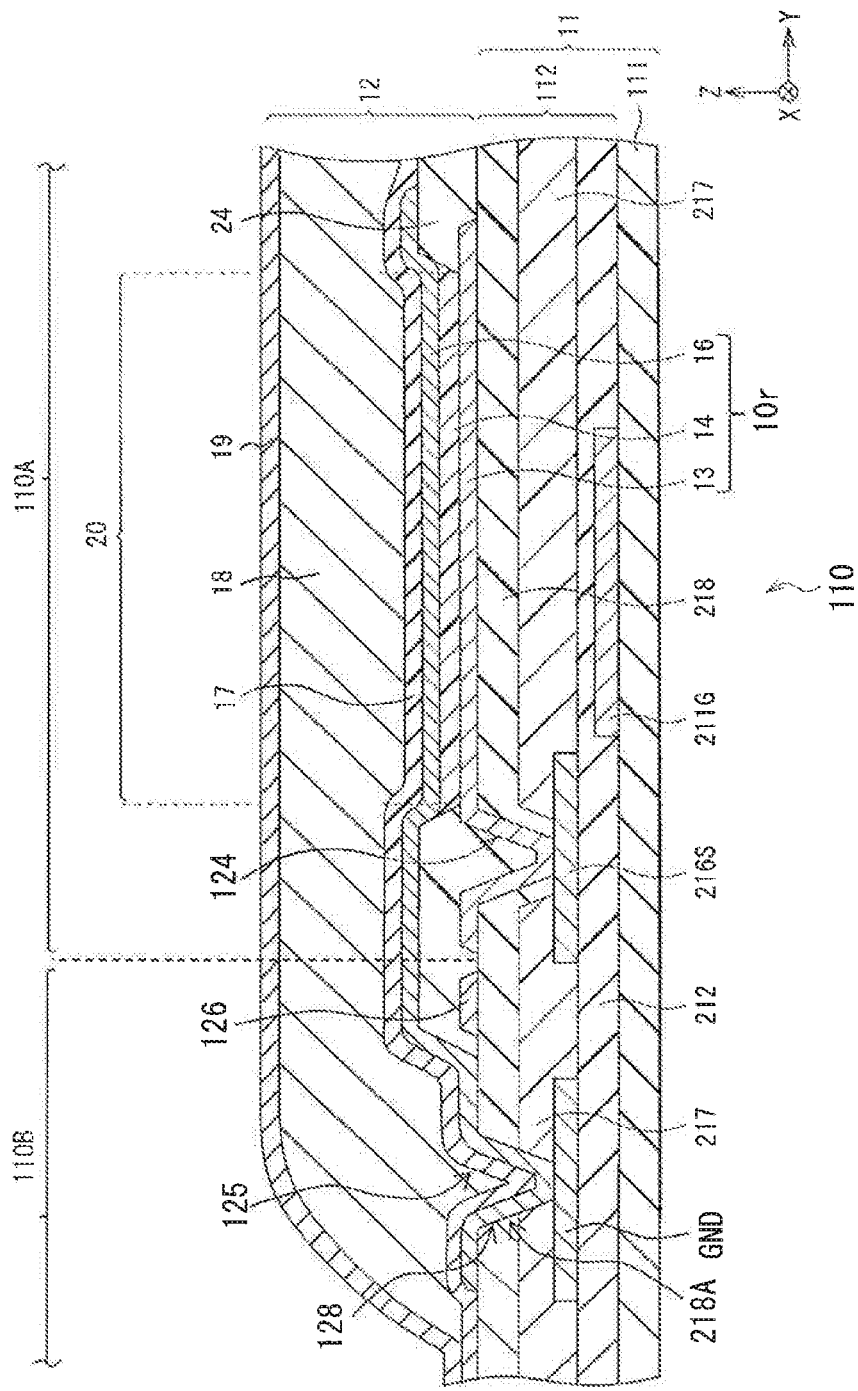
FIG. 4 is a diagram illustrating an example of a cross-sectional configuration taken along line IV-IV illustrated in FIG. 3.

In FIG. 3, rectangular broken lines surrounding the respective light-emission sections 20 each indicate a region in which an organic layer 14 illustrated in FIG. 4 is provided. In addition, rectangular solid lines surrounding the respective regions in which the organic layers 14 are provided each indicate a region in which the anode electrode layer 13 is provided. The anode electrode layer 13 may have a portion provided in a contact 124 (or in an opening). For example, the contact 124 may allow for electric conduction to a metal layer 216S that serves as the source electrode of the driving transistor Tr1. The metal layer 216S may correspond to a specific but non-limiting example of a "first wiring line" according to one embodiment of the disclosure. Further, a rectangular solid line surrounding the display region 110A indicates a region in which the cathode electrode layer 16 is provided. The cathode electrode layer 16 may have a portion provided in a contact 125 (or in an opening). For example, the contact 125 may allow for electric conduction to the power line GND. The power line GND may correspond to a specific but non-limiting example of a "second wiring line" according to one embodiment of the disclosure. The contact 125 and an outer edge of the cathode electrode layer 16 may be provided in the peripheral region 110B positioned around the display region 110A. Note that the number of subpixels 10 arranged in the X direction and the Y direction is not limited to the number illustrated in FIG. 3, and any number of subpixels 10 may be arranged in the X direction and the Y direction. In some embodiments, a subpixel that displays a yellow color, a subpixel that displays a white color, or both may be further provided. In such embodiments, one pixel or one display pixel may thus include four or more organic EL elements 10.

[Cross-Sectional Configuration of Display Panel 110]

Figure 5:
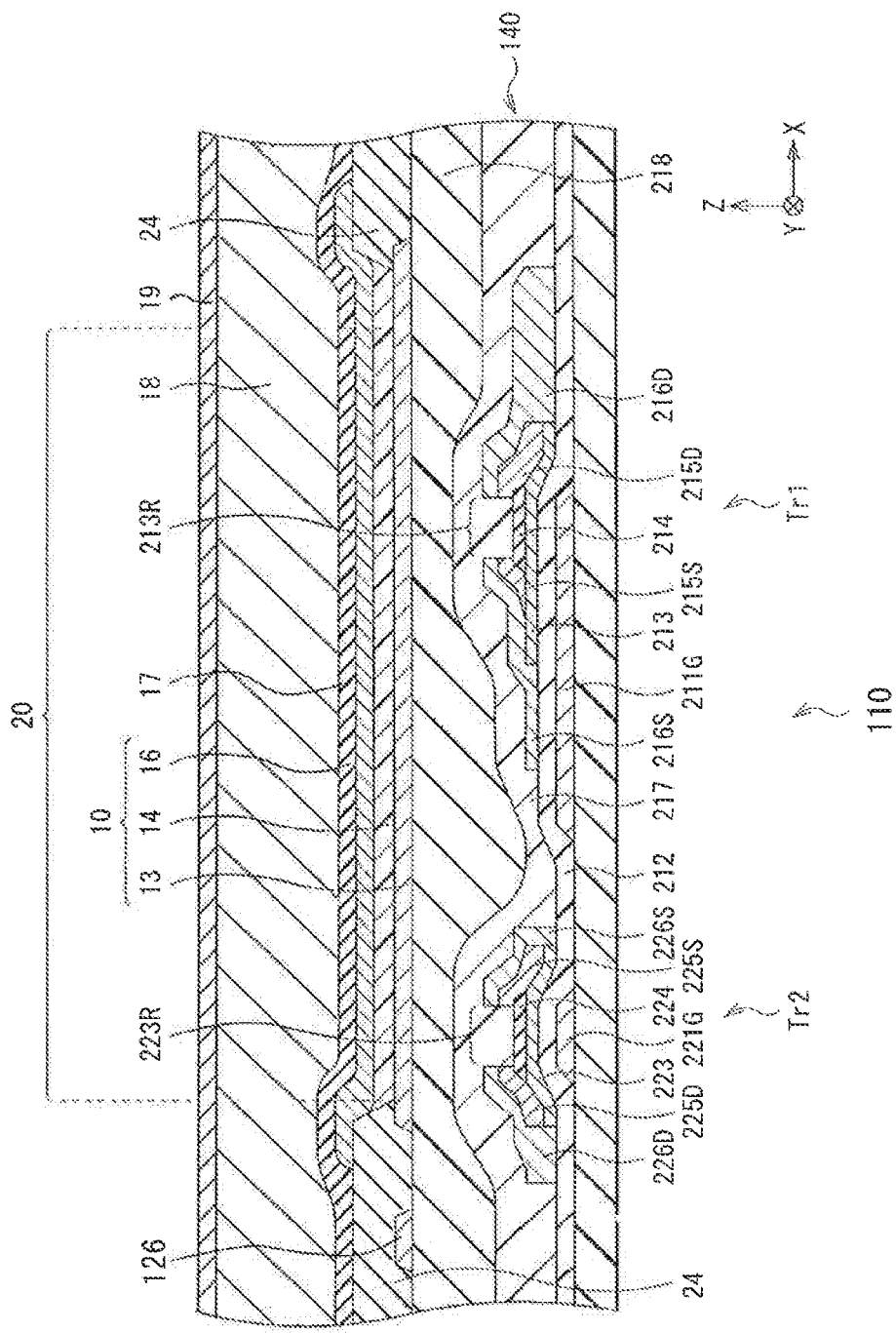
FIG. 5 is a diagram illustrating an example of a cross-sectional configuration taken along line V-V illustrated in FIG. 3.

FIG. 4 is a diagram illustrating a schematic configuration of a YZ cross section taken along line IV-IV illustrated in FIG. 3 and positioned in the vicinity of a boundary between the display region 110A and the peripheral region 110B. FIG. 5 is a diagram illustrating a schematic configuration of an XZ cross section of the display region 110A taken along line V-V illustrated in FIG. 3.

Referring to FIG. 4, the display region 110A may include a light-emitting element formation layer 12 provided on a base 11. The base 11 may include the pixel drive circuit formation layer 112 provided on a substrate 111. The light-emitting element formation layer 12 may include the plurality of organic EL elements 10. The inorganic insulation layer 17, the organic insulation layer 18, and the inorganic insulation layer 19 may be provided on the organic EL elements in this order from the base 11. The plurality of organic EL elements 10 is provided on a front surface of the planarization layer 218. Optionally, the plurality of organic EL elements 10 may be provided in contact with the front surface of the planarization layer 218. The planarization layer 218 may serve as a topmost layer of the pixel drive circuit formation layer 112. The organic EL elements 10 each may include the anode electrode layer 13, the organic layer 14, and the cathode electrode layer 16 that are provided in this order from the planarization layer 218. The organic layer 14 and the anode electrode layer 13 may be separated for each of the organic EL elements 10 by the aperture-defining insulation film 24. The planarization layer 218 and the aperture-defining insulation film 24 each may include a resin material that allows for a good patterning accuracy. Non-limiting examples of the resin material may include polyimide, an acrylic resin, and siloxane. The cathode electrode layer 16 may be so provided as to be shared by all of the organic EL elements 10. Note that specific configurations including the driving transistor Tr1, the switching transistor Tr2, etc., provided in the pixel drive circuit formation layer 112 are not illustrated in FIG. 4.

The base 11 may include the pixel drive circuit formation layer 112 provided on the substrate 111. The pixel drive circuit formation layer 112 may include the pixel drive circuit 140. The substrate 111 may be a support on which the plurality of organic EL elements 10 is provided and arranged. For example, the substrate 111 may be a film or a sheet that includes quartz, glass, a metallic foil, or a resin. In one example, the substrate 111 may include quartz or glass. Non-limiting examples of the resin material of the substrate 111 may include: a methacrylic resin such as polymethylmethacrylate (PMMA); a polyester resin such as polyethylene terephthalate (PET), polyethylene naphthalate (PEN), or polybutylene naphthalate (PBN); and a polycarbonate resin. In one example where the substrate 111 includes the resin film or the resin sheet, the resin film or the resin sheet may have a stack structure that suppresses water permeability or gas permeability, or may have a surface treatment that suppresses water permeability or gas permeability. The substrate 111 may have a surface that includes a metal layer 211G and a metal layer 221G as illustrated in FIG. 5. For example, the metal layer 211G may serve as a gate electrode of the driving transistor Tr1, and the metal layer 221G may serve as the gate electrode of the switching transistor Tr2. The metal layer 211G and the metal layer 221G may be covered with a gate insulation film 212. The gate insulation film 212 may include silicon nitride or silicon oxide.

Regions on the gate insulation film 212 that correspond to the metal layers 211G and 221G may include respective channel layers 213 and 223. The channel layers 213 and 223 each may include a semiconductor thin film such as an amorphous silicon film. Channel protection films 214 and 224 may respectively be provided on the channel layers 213 and 223. The channel protection films 214 and 224 each may have an insulating property, and may respectively be provided so as to occupy channel regions 213R and 223R. The channel regions 213R and 223R may be center regions of the respective channel layers 213 and 223. A drain electrode 215D and a source electrode 215S may be provided on respective regions positioned on both sides of the channel protection film 214, and a drain electrode 225D and a source electrode 225S may be provided on respective regions positioned on both sides of the channel protection film 224. The drain electrodes 215D and 225D and the source electrodes 215S and 225S each may include an n-type semiconductor thin film such as an n-type amorphous silicon film. The drain electrode 215D and the source electrode 215S may be separated from each other by the channel protection film 214, and their respective end faces may be provided away from each other with the channel region 213R being interposed therebetween. The drain electrode 225D and the source electrode 225S may be separated from each other by the channel protection film 224, and their respective end faces may be provided away from each other with the channel region 223R being interposed therebetween. Metal layers 216D and 226D serving as drain wiring lines may be so provided as to cover the respective drain electrodes 215D and 225D, and metal layers 216S and 226S serving as source wiring lines may be so provided as to cover the respective source electrodes 215S and 225S. For example, the metal layers 216D and 226D and the metal layers 216S and 226S each may have a structure that includes a titanium (Ti) layer, an aluminum (Al) layer, and a titanium layer that are stacked in order. The metal layer 216S may be coupled to a connection wiring line provided in the peripheral region 110B. The connection wiring line may establish coupling to the outside, and may be the FPC.

The pixel drive circuit 140 may be entirely covered with a protection layer (or a passivation film) 217. The protection layer 217 may include an inorganic material having low moisture permeability. Non-limiting example of the inorganic material having the low moisture permeability may include silicon oxide (SiOx), silicon nitride (SiNx), silicon oxynitride (SiNxOy), titanium oxide (TiOx), and aluminum oxide (AlxOy). The protection layer 217 may be provided on a back surface of the planarization layer 218, and may cover the pixel drive circuit 140, the metal layer 216S, and the power line GND. The planarization layer 218 may have an insulating property, and may be provided on the protection layer 217. For example, the planarization layer 218 may have a surface having extremely high flatness. The planarization layer 218 and the protection layer 217 may have fine contacts 124 and 125 as illustrated in FIG. 4. The contacts 124 and 125 each may correspond to a specific but non-limiting example of an "opening" according to one embodiment of the disclosure. The contact 125 is provided closer to an end edge of the display panel 110 than the contact 124. The contact 124 may include a portion of the anode electrode layer 13, allowing the anode electrode layer 13 to be electrically coupled, through the contact 124, to the metal layer 216S (the first wiring line) that serves as the source electrode of the driving transistor Tr1. The contact 124 may correspond to a specific but non-limiting example of a "first opening" according to one embodiment of the disclosure. The contact 125 may include a portion of the cathode electrode layer 16, allowing the cathode electrode layer 16 to be electrically coupled, through the contact 125, to the power line GND (the second wiring line). The contact 125 may correspond to a specific but non-limiting example of a "second opening" according to one embodiment of the disclosure. The power line GND may be coupled to a connection wiring line provided in the peripheral region 110B. The connection wiring line may establish coupling to the outside, and may be the FPC.

The anode electrode layer 13 may be provided on the front surface of the planarization layer 218, and may also serve as a reflection layer. To increase luminescent efficiency, the anode electrode layer 13 may include a material having as high reflectance as possible. For example, the anode electrode layer 13 may include aluminum (Al), or may include a metal material that contains aluminum (Al). Non-limiting examples of the metal material of the anode electrode layer 13 may include an aluminum neodymium alloy (AlNd), an aluminum nickel alloy (AlNi), and an aluminum indium alloy (AlIn). For example, the anode electrode layer 13 may have a stack that includes an aluminum layer and a neodymium layer that are stacked in this order from the planarization layer 218, a stack that includes the aluminum layer and a nickel layer that are stacked in this order from the planarization layer 218, or a stack that includes the aluminum layer and an indium layer that are stacked in this order from the planarization layer 218.

The peripheral region 110B may also include a moisture blocker 128. The moisture blocker 128 may be so provided as to surround the display region 110A. The moisture blocker 128 may include an opening 218A and a portion of the cathode electrode layer 16. The opening 218A may be a region in which the planarization layer 218 is removed in such a manner as to surround the display region 110A. The portion of the cathode electrode layer 16 may cover an inner surface of the opening 218A, i.e., may cover an end face of the planarization layer 218 exposed to the opening 218A. The moisture blocker 128 helps to prevent entry of a moisture from an outer edge of the peripheral region 110B to the display region 110A through the planarization layer 218. It is to be noted that, in the contact 125, an opening provided on the planarization layer 218 may serve as the opening 218A. Accordingly, the contact 125 and the power line GND may also be provided in such a manner as to surround the display region 110A as with the opening 218A, and the cathode electrode layer 16 may be in contact with the power line GND in the peripheral region 110B in such a manner as to surround the display region 110A.

The anode electrode layer 13 may have a thickness in a stack direction (hereinafter simply referred to as a "thickness") in a range from 10 nm to 1000 nm, for example. The anode electrode layer 13 may include the material described above, or a material other than the material described above. For example, the anode electrode layer 13 may include any of metal elements including chromium (Cr), gold (Au), platinum (Pt), nickel (Ni), copper (Cu), tungsten (W), and silver (Ag), or may include an alloy having any combination of the metal elements. The anode electrode layer 13 may also have a stack structure that includes a metal film and a transparent electrically-conductive film. For example, the metal film may include any of the metal elements, or may include an alloy having any combination of the metal elements. The transparent electrically-conductive film may include an oxide containing indium and tin (ITO), indium-zinc oxide (InZnO), or a compound containing zinc oxide (ZnO) and aluminum (Al), for example.

The aperture-defining insulation film 24 may fill a gap provided between the anode electrode layers 13 and the organic layers 14 of the respective organic EL elements 10 that are adjacent to each other. In other words, the aperture-defining insulation film 24 may fill a gap provided between the light-emission sections 20. The aperture-defining insulation film 24 may also be referred to as a partition wall, which ensures an insulating property between the anode electrode layer 13 and the cathode electrode layer 16 and accurately defines a contour of the light-emission section 20 of the organic EL element 10. In other words, the aperture-defining insulation film 24 may define a region in which light is emitted.

The organic layer 14 may be seamlessly provided throughout the light-emission section 20 defined by the aperture-defining insulation film 24. For example, the organic layer 14 may include a hole injection layer, a hole transport layer, a light-emitting layer, an electron transport layer, and an electron injection layer that are stacked in this order from the planarization layer 218. In one example, the hole injection layer, the hole transport layer, the electron transport layer, or the electron injection layer may be omitted on an as-necessary basis.

The cathode electrode layer 16 may be a common electrode that is shared by all of the organic EL elements 10. The cathode electrode layer 16 may oppose the anode electrode layers 13 of the respective organic EL elements 10. The cathode electrode layer 16 may cover the organic layer 14 and the aperture-defining insulation film 24. For example, the cathode electrode layer 16 may have a thickness in a range from 2 nm to 15 nm. The cathode electrode layer 16 may be a transparent electrode that includes an electrically-conductive material having translucency to light generated by the organic layer 14. Non-limiting examples of a material configuring such a cathode electrode layer 16 may include: ITO; a compound containing indium, zinc (Zn), and oxygen (such as IZO); and ZnO (zinc oxide). For example, the cathode electrode layer 16 may be a semi-transmissive reflection film that includes any of metal elements including aluminum (Al), magnesium (Mg), calcium (Ca), and sodium (Na), or may include an alloy having any combination of the metal elements. Alternatively, for example, the cathode electrode layer 16 may include an alloy that contains magnesium and silver (an MgAg alloy), or an alloy that contains aluminum (Al) and lithium (Li) (an AlLi alloy).

In an example embodiment, the display panel 110 includes at least one sensing wiring line 126 provided in a region that is positioned in the same layer as the anode electrode layer 13 and that is positioned between the anode electrode layer 13 and the contact 125 (or the moisture blocker 128). FIGS. 3 to 5 each illustrate an example embodiment in which one sensing wiring line 126 is provided in a region that is positioned in the same layer as the anode electrode layer 13 and that is positioned between the anode electrode layer 13 and the contact 125 (or the moisture blocker 128). In some embodiments, the at least one sensing wiring line 126 may be provided along an outer edge of the display panel 110. For example, the at least one sensing wiring line 126 may surround the display region 110A of the display panel 110. The at least one sensing wiring line 126 may have both ends that are coupled to respective pad electrodes 127 provided in the peripheral region 110B of the display panel 110. In an example embodiment, the at least one sensing wiring line 126 is electrically separated from the anode electrode layer 13, the cathode electrode layer 16, the metal layer 216S, and the power line GND.

Figure 6:
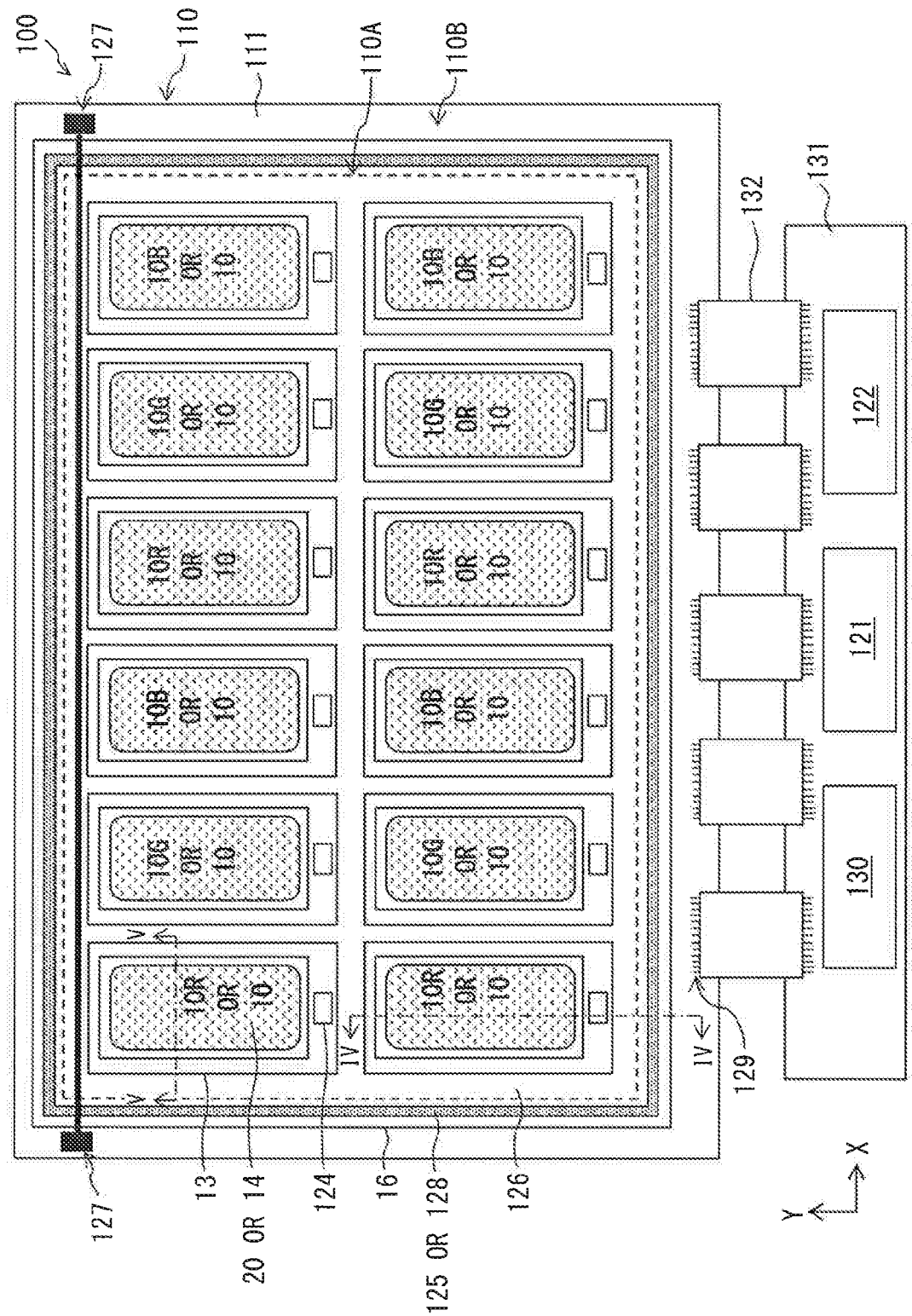
FIG. 6 is a diagram illustrating a modification example of the planar configuration of the display region illustrated in FIG. 1.

In some embodiments, the sensing wiring line 126 may be provided along the outer edge of the display panel from both ends of the mounting terminals 129. In some embodiments, the sensing wiring line 126 may not be provided on a side on which the mounting terminals 129 are provided, and may be provided only on three sides excluding the side on which the mounting terminals 129 are provided. It is to be noted that, in an example case where a direction in which the display panel 110 is likely to be bent is determined in advance, stress may possibly be applied to the sides that are orthogonal to the bending direction, which can cause a loss or a defect in one or both of the inorganic insulation layer 17 and the inorganic insulation layer 19. In this example case, the sensing wiring line 126 may be provided only on the sides that are orthogonal to the direction in which the display panel 110 is likely to be bent. In an example case where the direction in which the display panel 110 is likely to be bent is parallel to the side on which the mounting terminals 129 are provided, the sensing wiring line 126 may be provided on the side that does not include the mounting terminals 129 and that is parallel to the side on which the mounting terminals 129 are provided, as illustrated by way of example in FIG. 6.

In some embodiments, the at least one sensing wiring line 126 may be provided in the same layer as the anode electrode layer 13, and may include the same material as the anode electrode layer 13. In some embodiments, the at least one sensing wiring line 126 may be configured to vary its resistance value on the basis of a corrosion caused by a moisture. In such embodiments where the resistance value of the least one sensing wiring line 126 is configured to be varied on the basis of the corrosion caused by the moisture, the at least one sensing wiring line 126 may include a metal material containing aluminum (Al). Non-limiting examples of a material configuring the at least one sensing wiring line 126 may include an aluminum neodymium alloy (AlNd), an aluminum nickel alloy (AlNi), and an aluminum indium alloy (AlIn). In some embodiments, the at least one sensing wiring line 126 may have a stack that includes an aluminum layer and a neodymium layer that are stacked in this order from the planarization layer 218. In some embodiments, the at least one sensing wiring line 126 may have a stack that includes the aluminum layer and a nickel layer that are stacked in this order from the planarization layer 218. In some embodiments, the at least one sensing wiring line 126 may have a stack that includes the aluminum layer and an indium layer that are stacked in this order from the planarization layer 218.

The inorganic insulation layer 17 and the inorganic insulation layer 19 each may cover the organic EL elements 10, and each may include an inorganic material having low moisture absorbency. Non-limiting examples of the inorganic material having the low moisture absorbency may include silicon oxide (SiOx), silicon nitride (SiNx), silicon oxynitride (SiNxOy), titanium oxide (TiOx), and aluminum oxide (AlxOy). One or both of the inorganic insulation layer 17 and the inorganic insulation layer 19 may include a metal material such as aluminum. Providing the inorganic insulation layer 17 and the inorganic insulation layer 19 blocks the organic EL elements 10 from the external air and helps to prevent entry of the moisture from an external environment into the organic EL elements 10. The inorganic insulation layer 17 and the inorganic insulation layer 19 may be so provided substantially uniformly as to cover the cathode electrode layer 16, the aperture-defining insulation film 24, and the planarization layer 218. For example, the inorganic insulation layer 17 and the inorganic insulation layer 19 may cover the organic EL elements 10, the aperture-defining insulation film 24, and the planarization layer 218 continuously from the display region 110A to the peripheral region 110B. It is sufficient, however, for the inorganic insulation layer 17 and the inorganic insulation layer 19 to cover at least the aperture-defining insulation film 24 and the planarization layer 218 in the peripheral region 110B. One reason is that the aperture-defining insulation film 24 and the planarization layer 218 each include the organic material having high moisture absorbency and hence it is advantageous to prevent the entry of the moisture into the organic EL elements 10 through the aperture-defining insulation film 24 and the planarization layer 218. Note that the inorganic insulation layer 17 and the inorganic insulation layer 19 may cover the planarization layer 218 in one example where the aperture-defining insulation film 24 is not provided in the peripheral region 110B. One or both of the inorganic insulation layer 17 and the inorganic insulation layer 19 may have a single layer structure. Alternatively, one or both of the inorganic insulation layer 17 and the inorganic insulation layer 19 may have a multi-layer structure in one example where a thickness is to be increased. One reason is to reduce internal stress in the inorganic insulation layer 17 and the inorganic insulation layer 19. The organic insulation layer 18 may be a transparent resin layer provided substantially uniformly on the inorganic insulation layer 17. For example, the organic insulation layer 18 may be interposed between the inorganic insulation layer 17 and the inorganic insulation layer 19. The organic insulation layer 18 may include an epoxy resin or an acrylic resin, for example. In one example, the organic insulation layer 18 may include a thermosetting resin or an ultraviolet curable resin.

In one example, a sealing substrate may be provided on the organic insulation layer 18 through a layer such as an adhesive layer. The sealing substrate may seal the organic EL elements 10. The sealing substrate may include a material having high transparency to pieces of color light outputted from the respective subpixel 10R, subpixel 10G, and subpixel 10B, such as transparent glass.

Example Effects

A description is given next of some example effects of the display panel 110 according to an example embodiment.

In general, a display panel that includes an organic EL element can suffer from entry of moisture from a bezel region of the display panel. The entry of moisture can cause a deterioration in the organic EL element, which in turn can lead to a decrease in luminance of light emitted from the organic EL element, or can lead to an unstable emission of light.

The entry of moisture from the bezel region of the display panel to the organic EL element often takes several hundreds of hours to several thousands of hours, meaning that it is extremely difficult to detect a display defect prior to shipment of the display panel, and that there is a concern of an occurrence of the display defect after the shipment.

To address such concerns, a proposal has been made to provide a display panel with a mechanism that senses the moisture that enters from the bezel region of the display panel to thereby detect the display panel that can cause the display defect after the shipment, as disclosed in Japanese Unexamined Patent Application Publication No. 2009-110865, for example. The technique disclosed in Japanese Unexamined Patent Application Publication No. 2009-110865, however, has a concern in which the mechanism may possibly sense the moisture even in a case where an occurrence of a display defect is practically unlikely.

In contrast, according to an example embodiment, at least one sensing wiring line 126 is provided in a region that is positioned in the same layer as the anode electrode layer 13 and that is positioned between the anode electrode layer 13 and the contact 125 (or the moisture blocker 128). Thus, in an example case where the inorganic insulation layer 17 and the inorganic insulation layer 19 that cover the organic EL elements 10 each have a defect such as a crack or a hole and where a moisture has traveled through the defects of the inorganic insulation layer 17 and the inorganic insulation layer 19 and has further entered through the contact 125 (or the moisture blocker 128), the moisture is sensed by the at least one sensing wiring line 126 provided closer to the contact 125 (or the moisture blocker 128) than the organic EL elements 10. For example, in some embodiments where one sensing wiring line 126 is disposed around the display region 110A of the display panel 110 as illustrated in FIG. 3, the moisture dissolves the sensing wiring line 126 to disconnect the sensing wiring line 126, thereby causing a resistance between the two pad electrodes 127 to be significantly larger than that of a case where the sensing wiring line 126 is not disconnected. Accordingly, it is possible to sense the entry of the moisture. Hence, as compared with a case where a sensing wiring line is provided in a structure that is completely different from a structure provided around the organic EL elements 10, it is possible to detect, with improved accuracy, a display panel that is likely to cause a display defect attributed to reaching, to the organic EL element 10, of the moisture that has traveled through the defects of the inorganic insulation layer 17 and the inorganic insulation layer 19 and has further traveled through the contact 125 (or the moisture blocker 128).

In some embodiments, the at least one sensing wiring line 126 may be provided in the same layer as the anode electrode layer 13, and may include the same material as the anode electrode layer 13. In such embodiments, it is possible to form the at least one sensing wiring line 126 and the anode electrode layer 13 collectively in a manufacturing process. Hence, it is possible to detect, with improved accuracy, a display panel that is likely to cause a display defect without increasing a manufacturing cost.

In some embodiments, the at least one sensing wiring line 126 may be configured to vary its resistance value on the basis of the moisture. In some embodiments, the at least one sensing wiring line 126 may include a metal material containing aluminum. In such embodiments, the aluminum contained in the at least one sensing wiring line 126 is dissolved by the moisture into the moisture when the moisture comes into contact with the at least one sensing wiring line 126, thereby varying the resistance of the at least one sensing wiring line 126. By sensing the variation in the resistance, it is possible to detect, with improved accuracy, a display panel that is likely to cause a display defect.

In some embodiments, the at least one sensing wiring line 126 may be provided along the outer edge of the display panel 110. Hence, it is possible to sense, with improved accuracy, the moisture that has entered from an end of the display panel 110

3. MODIFICATION EXAMPLE

First Modification Example

Figure 7:
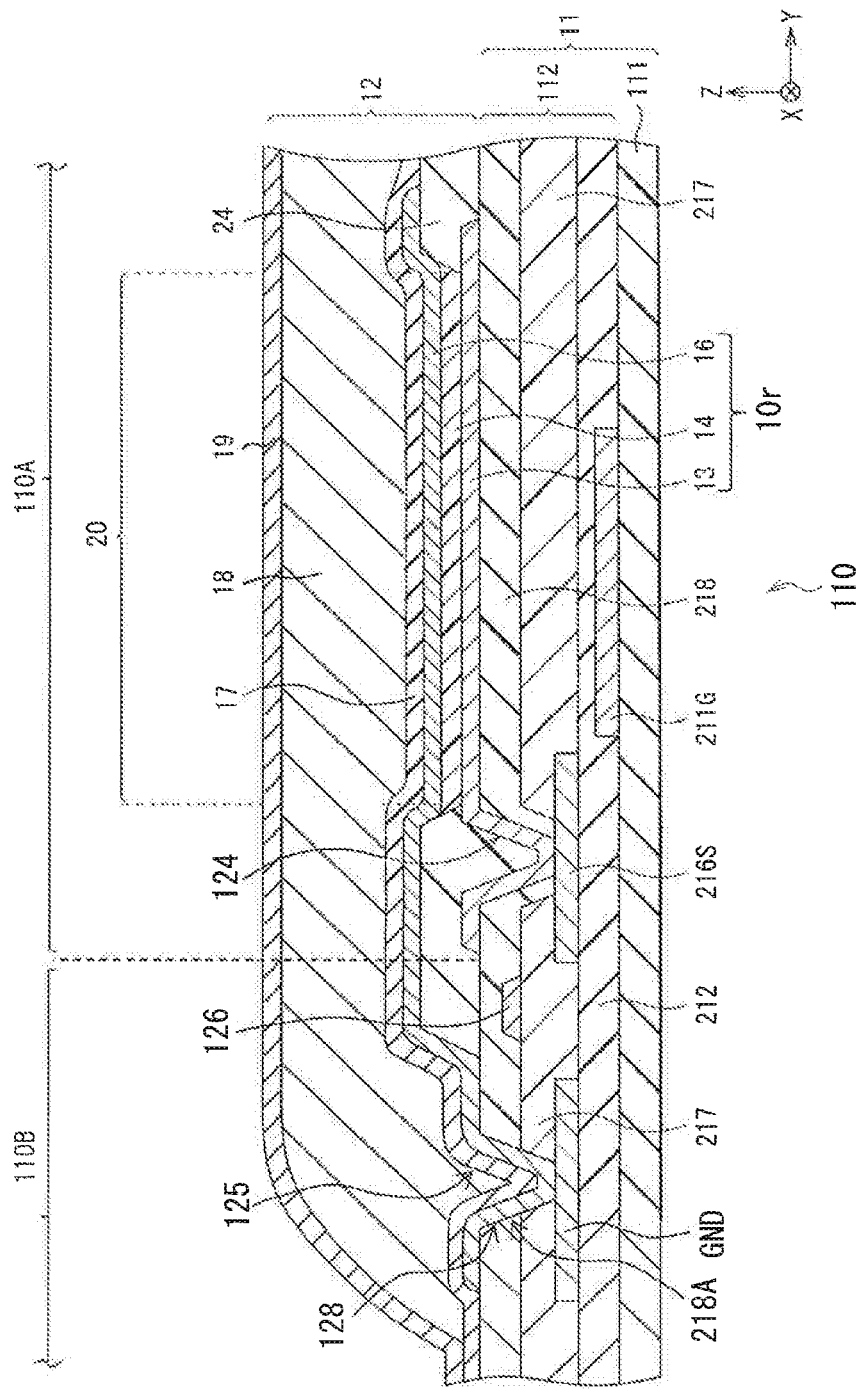
FIG. 7 is a diagram illustrating a modification example of the cross-sectional configuration taken along the line Iv-Iv illustrated in FIG. 3.
Figure 8:
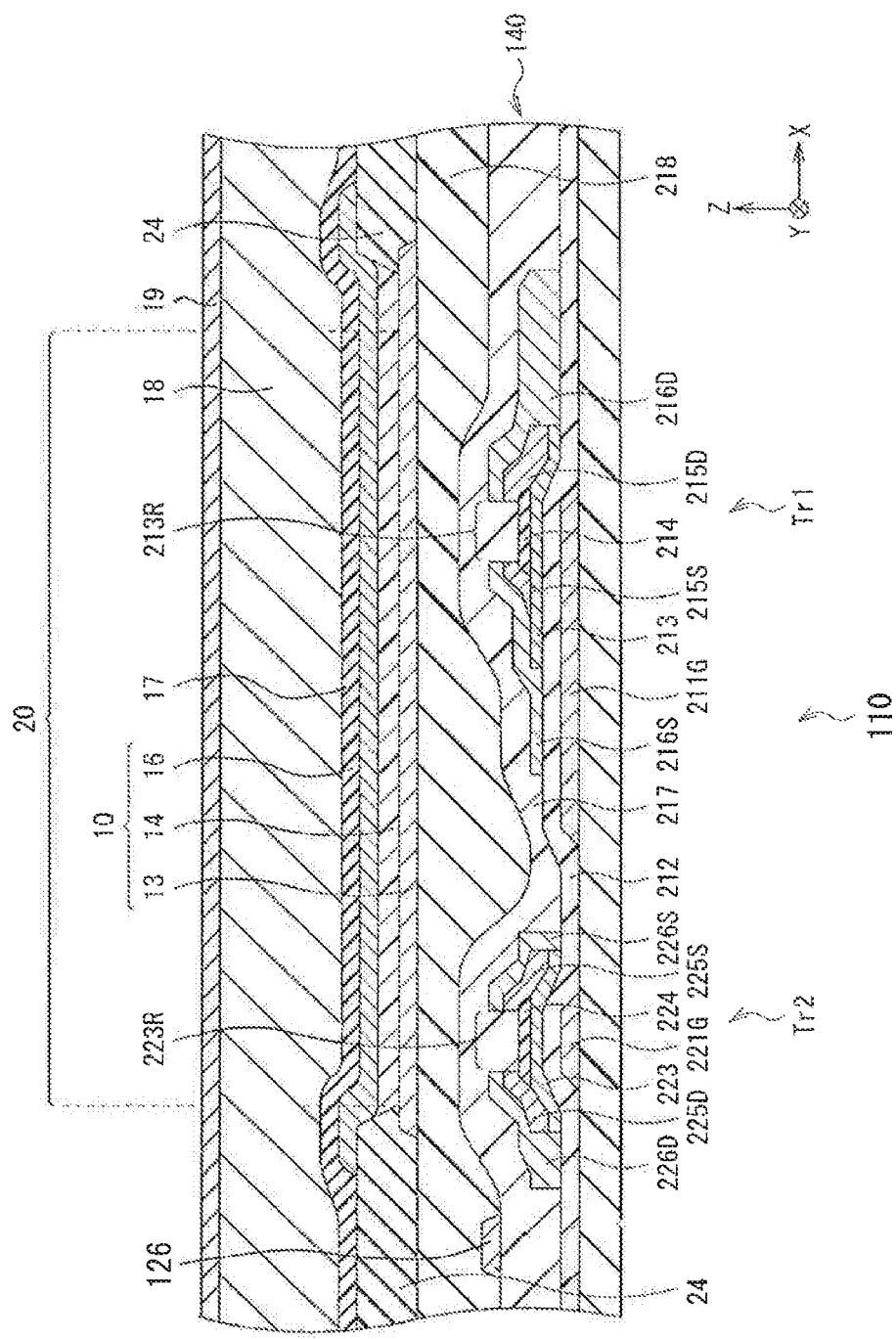
FIG. 8 is a diagram illustrating a modification example of the cross-sectional configuration taken along the line v-v illustrated in FIG. 3.

In some embodiments, the at least one sensing wiring line 126 may be provided between the protection layer 217 and the planarization layer 218 as illustrated by way of example in FIGS. 7 and 8. Thus, in an example case where the inorganic insulation layer 17 and the inorganic insulation layer 19 that cover the organic EL elements 10 each have a defect such as the crack or the hole and where the moisture has traveled through the defects of the inorganic insulation layer 17 and the inorganic insulation layer 19 and has further entered through the contact 125 (or the moisture blocker 128), the moisture is sensed by the at least one sensing wiring line 126 provided closer to the contact 125 than the organic EL elements 10.

Hence, as compared with a case where a sensing wiring line is provided in a structure that is completely different from a structure provided around the organic EL elements 10, it is possible to detect, with improved accuracy, a display panel that is likely to cause a display defect attributed to reaching, to the organic EL element 10, of the moisture that has traveled through the defects of the inorganic insulation layer 17 and the inorganic insulation layer 19 and has further traveled through the contact 125 (or the moisture blocker 128).

Second Modification Example

Figure 9:
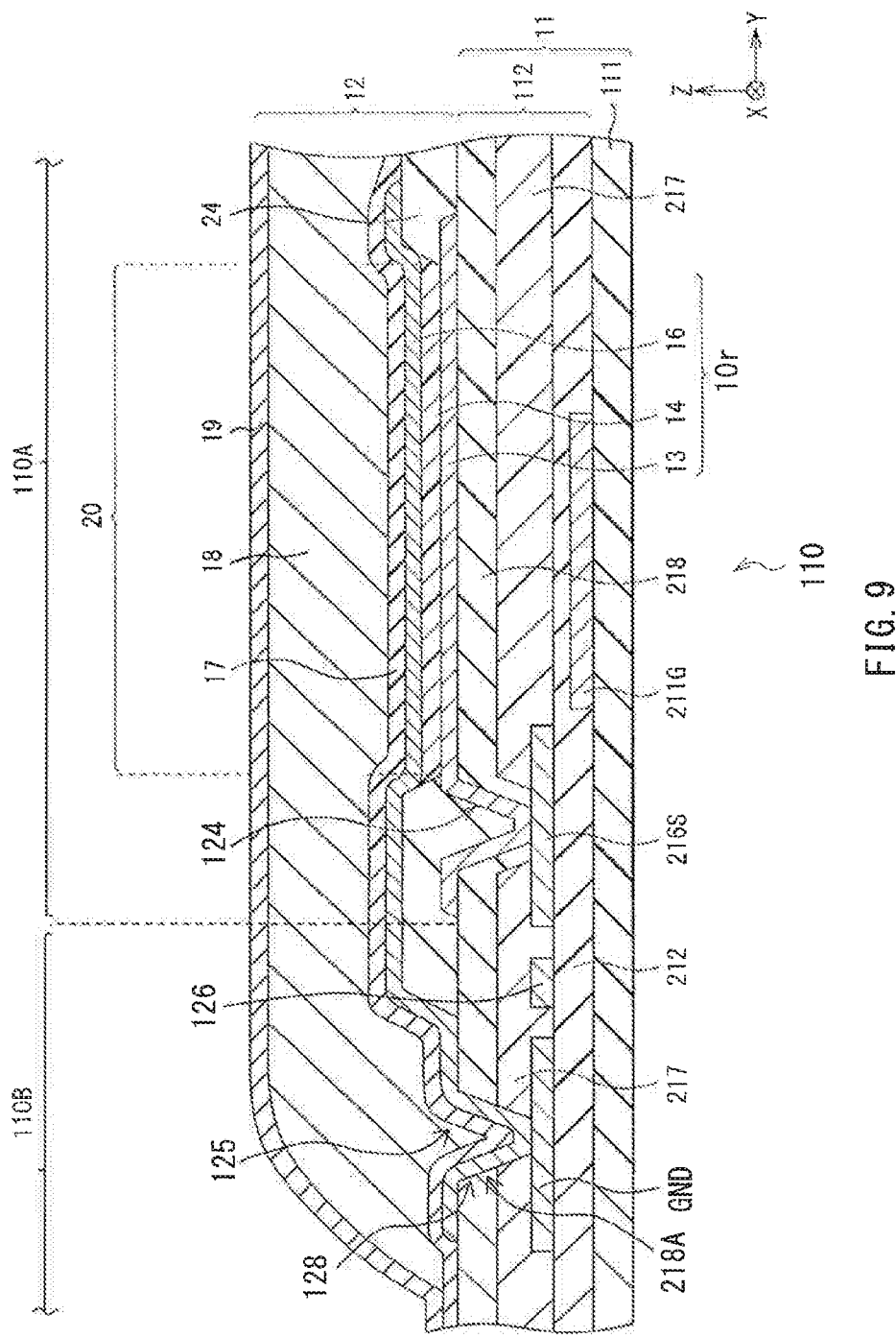
FIG. 9 is a diagram illustrating a modification example of the cross-sectional configuration taken along the line Iv-Iv illustrated in FIG. 3.
Figure 10:
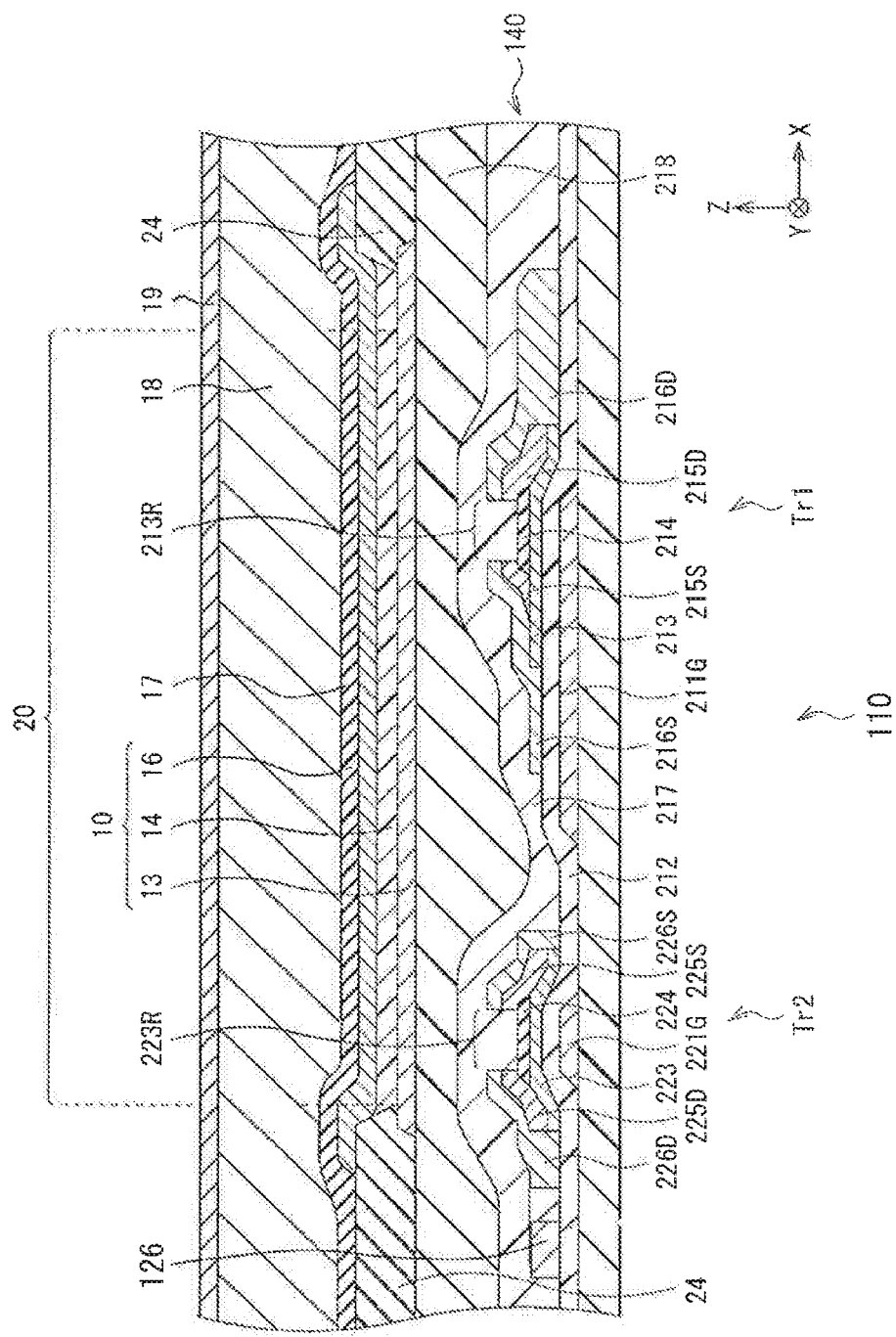
FIG. 10 is a diagram illustrating a modification example of the cross-sectional configuration taken along the line v-v illustrated in FIG. 3.

In some embodiments, the at least one sensing wiring line 126 may be provided in the same layer as the power line GND as illustrated by way of example in FIGS. 9 and 10. Thus, in an example case where the inorganic insulation layer 17 and the inorganic insulation layer 19 that cover the organic EL elements 10 each have a defect such as the crack or the hole and where the moisture has traveled through the defects of the inorganic insulation layer 17 and the inorganic insulation layer 19 and has further entered through the contact 125 (or the moisture blocker 128), the moisture is sensed by the at least one sensing wiring line 126 provided closer to the contact 125 than the organic EL elements 10. Hence, as compared with a case where a sensing wiring line is provided in a structure that is completely different from a structure provided around the organic EL elements 10, it is possible to detect, with improved accuracy, a display panel that is likely to cause a display defect attributed to reaching, to the organic EL element 10, of the moisture that has traveled through the defects of the inorganic insulation layer 17 and the inorganic insulation layer 19 and has further traveled through the contact 125 (or the moisture blocker 128).

In some embodiments, the at least one sensing wiring line 126 may be provided in the same layer as the power line GND, and may include the same material as the power line GND. In such embodiments, it is possible to form the at least one sensing wiring line 126 and the power line GND collectively in a manufacturing process. Hence, it is possible to detect, with improved accuracy, a display panel that is likely to cause a display defect without increasing a manufacturing cost.

Third Modification Example

Figure 11:
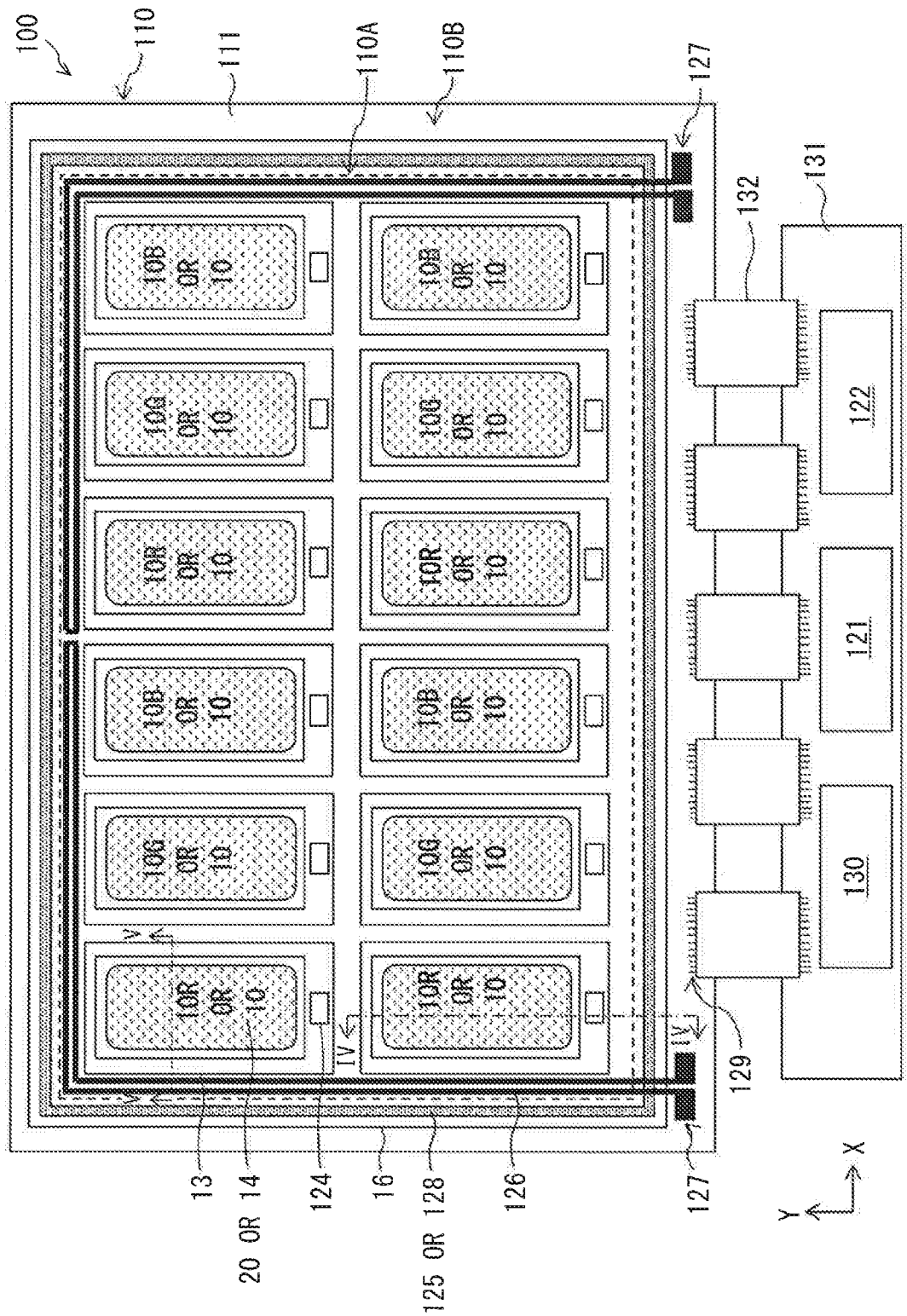
FIG. 11 is a diagram illustrating a modification example of the planar configuration of the display region illustrated in FIG. 1.

In each of the foregoing example embodiment and the first and the second modification examples, the multiple sensing wiring lines 126 may be provided that are disposed parallel to each other. In some embodiments, two sensing wiring lines 126 disposed parallel to each other may have respective one ends coupled to their respective pad electrodes 127, and may have respective other ends that are coupled to each other, as illustrated by way of example in FIG. 11. Thus, the moisture dissolves one or more of the sensing wiring lines 126 to disconnect the one or more of the sensing wiring lines 126, thereby causing a resistance between the two pad electrodes 127 to be significantly larger than that of a case where the one or more of the sensing wiring lines 126 is not disconnected. Accordingly, it is possible to sense the entry of the moisture.

Figure 12:
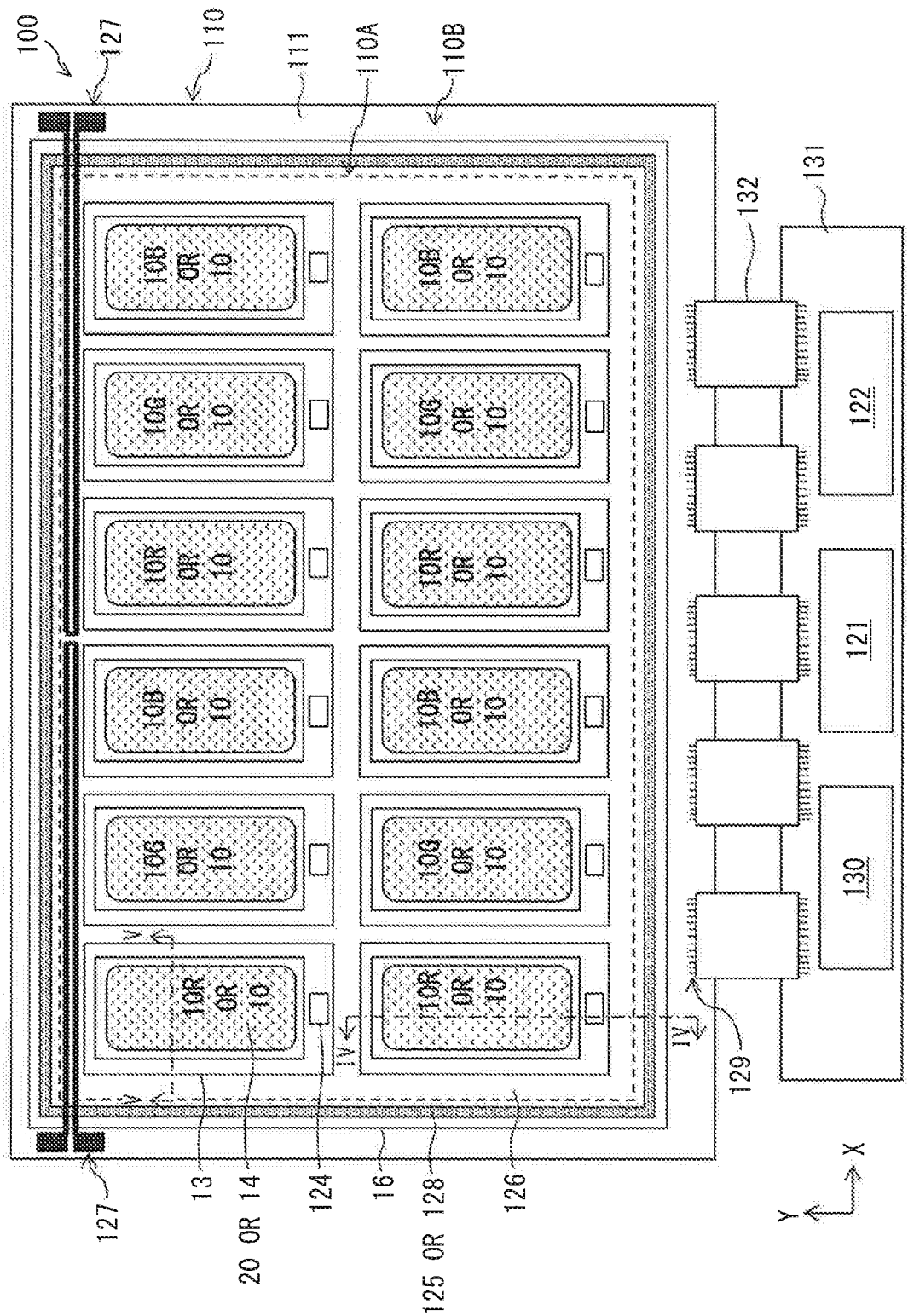
FIG. 12 is a diagram illustrating a modification example of the planar configuration of the display region illustrated in FIG. 1.

It is to be noted that, in an example case where a direction in which the display panel 110 is likely to be bent is determined in advance in the third modification example, stress may possibly be applied to the sides that are orthogonal to the bending direction, which can cause a loss or a defect in one or both of the inorganic insulation layer 17 and the inorganic insulation layer 19. In this example case, the sensing wiring lines 126 may be provided only on the sides that are orthogonal to the direction in which the display panel 110 is likely to be bent. In an example case where the direction in which the display panel 110 is likely to be bent is parallel to the side on which the mounting terminals 129 are provided, the sensing wiring lines 126 may be provided on the side that does not include the mounting terminals 129 and that is parallel to the side on which the mounting terminals 129 are provided, as illustrated by way of example in FIG. 12.

Figure 13:
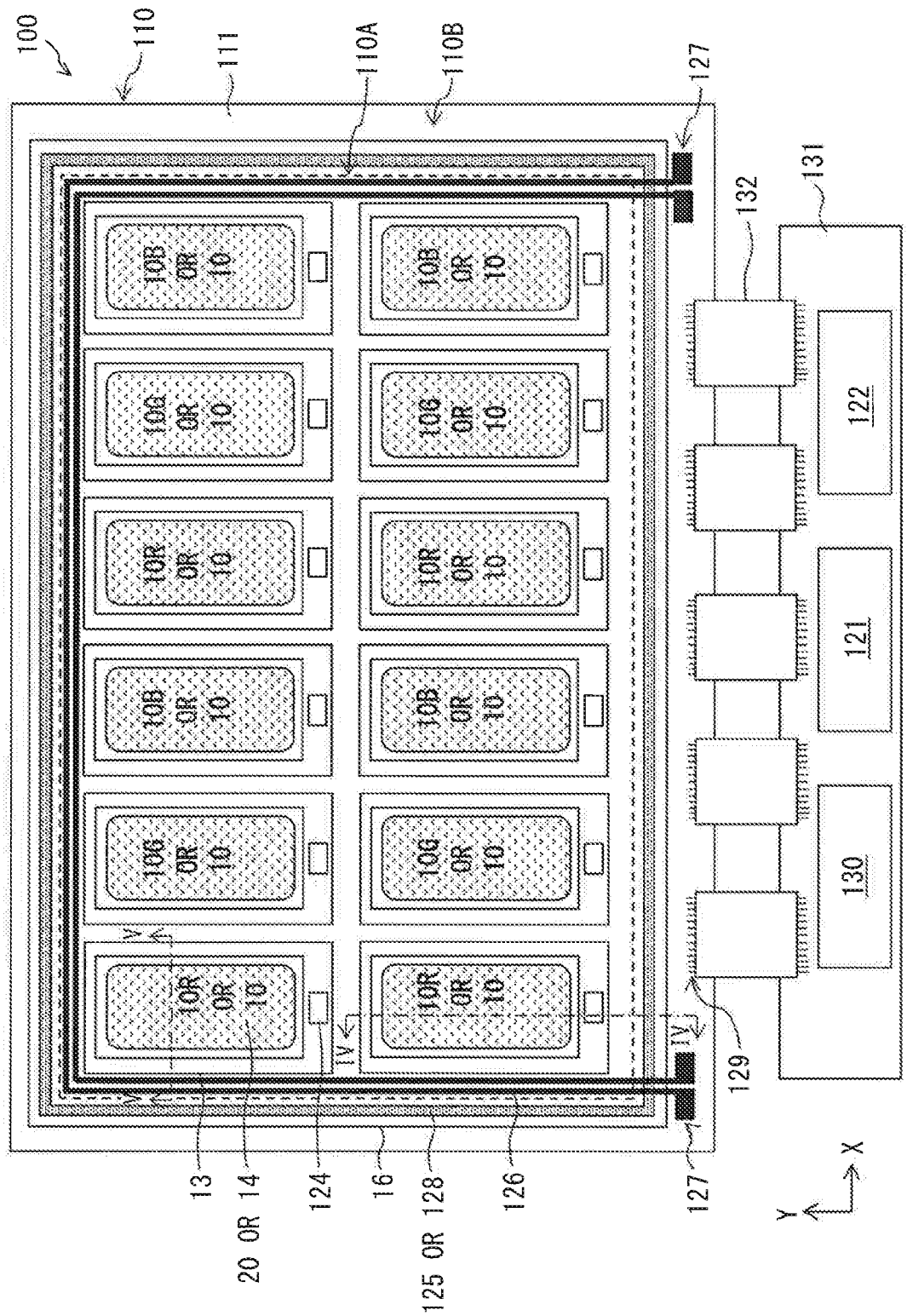
FIG. 13 is a diagram illustrating a modification example of the planar configuration of the display region illustrated in FIG. 1.

In some embodiments, the two sensing wiring lines 126 disposed parallel to each other may have respective ends coupled to their respective pad electrodes 127, as illustrated by way of example in FIG. 13. Thus, the moisture dissolves one or more of the sensing wiring lines 126 and a thus-dissolved wiring line material (such as aluminum) causes short circuit between the two sensing wiring lines 126 disposed parallel to each other, thereby causing a resistance between the two pad electrodes 127 to be significantly smaller than that of a case where no short circuit occurs between the two sensing wiring lines 126 disposed parallel to each other. Accordingly, it is possible to sense the entry of the moisture.

Figure 14:
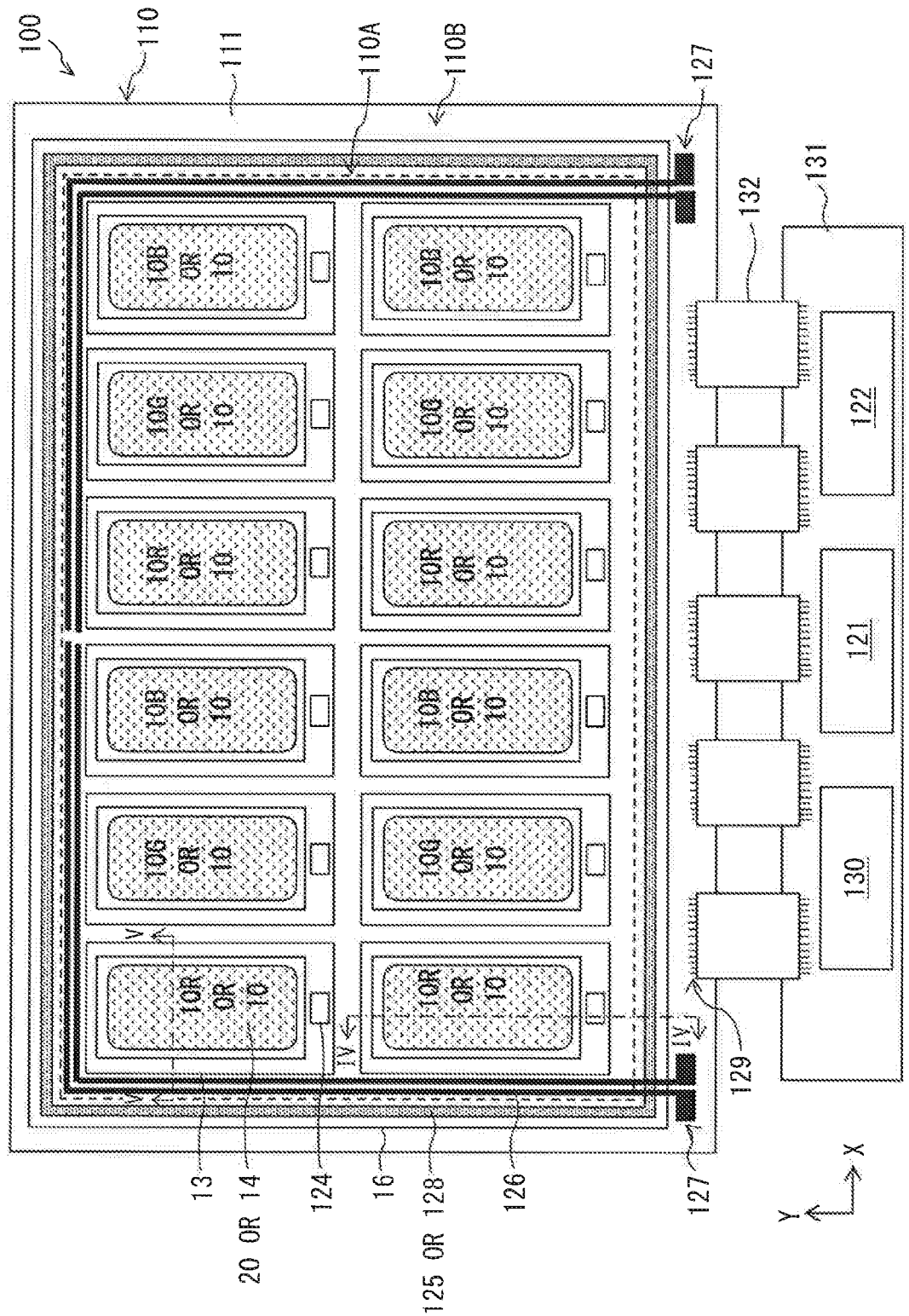
FIG. 14 is a diagram illustrating a modification example of the planar configuration of the display region illustrated in FIG. 1.

In some embodiments, the two sensing wiring lines 126 disposed parallel to each other may have respective one ends that are open, and may have respective other ends that are coupled to their respective pad electrodes 127, as illustrated by way of example in FIG. 14. Thus, the moisture dissolves one or more of the sensing wiring lines 126 and a thus-dissolved wiring line material (such as aluminum) causes short circuit between the two sensing wiring lines 126 disposed parallel to each other, thereby causing a resistance between the two pad electrodes 127 to be significantly smaller than that of a case where no short circuit occurs between the two sensing wiring lines 126 disposed parallel to each other. Accordingly, it is possible to sense the entry of the moisture.

Fourth Modification Example

In each of the foregoing example embodiment and the first to the third modification examples, a self-luminous light-emitting layer may be provided instead of the organic layer 14, and self-luminous elements may be provided instead of the organic EL elements 10. In such embodiments, it is possible to achieve effects similar to those achieved by any of the foregoing example embodiment and the first to the third modification examples.

4. APPLICATION EXAMPLES

Some application examples of the display panel 110 according to any of the foregoing example embodiment and its modification examples will now be described. The display panel 110 according to any of the foregoing example embodiment and its modification examples may be applied to a display unit of various electronic apparatuses that display an image or a video image based on an external or internal image signal. Specific but non-limiting examples of the electronic apparatuses may include television apparatuses, digital cameras, laptop personal computers, sheet-shaped personal computers, terminal devices such as mobile phones, and video cameras.

Figure 15:
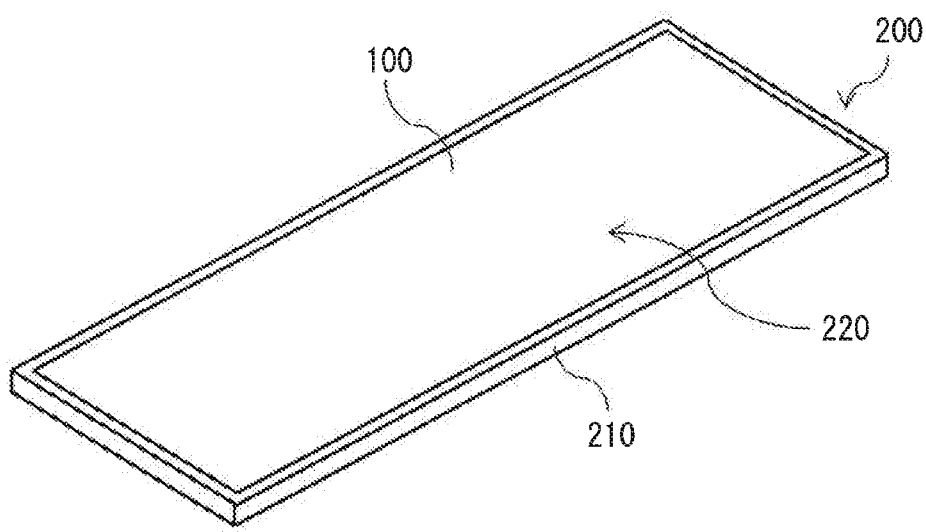
FIG. 15 is a diagram illustrating an example of an external appearance of an electronic apparatus according to an application example of the display unit.

FIG. 15 is a schematic perspective view of an electronic apparatus 200 according to an application example. The electronic apparatus 200 may be a sheet-shaped personal computer having a display surface 220 on a main face of a body 210. The electronic apparatus 200 may include the display unit 100 according to any of the foregoing example embodiment and its modification examples on the display surface 220 of the electronic apparatus 200. The display unit 100 according to any of the foregoing example embodiment and its modification examples may be disposed such that the image display surface faces outward. According to the application example in which the display unit 100 according to any of the foregoing example embodiment and its modification examples is disposed on the display surface 220, it is possible to achieve the electronic apparatus 200 that is resistant to a pixel defect in the display unit 100.

Although the disclosure is described with reference to the example embodiments and the application examples hereinabove, these example embodiments and application examples are not to be construed as limiting the scope of the disclosure and may be modified in a wide variety of ways. It should be appreciated that the effects described herein are mere examples. Effects of the example embodiment and application examples of the disclosure are not limited to those described herein, and may be different from those described herein. The disclosure may further include any effects other than those described herein.

Furthermore, the technology encompasses any possible combination of some or all of the various embodiments and the modifications described herein and incorporated herein.

It is possible to achieve at least the following configurations from the above-described example embodiments of the disclosure.

(1) A display panel including:
  a planarization layer having a first opening and a second opening that is provided closer to an end edge of the display panel than the first opening;
  a plurality of self-luminous elements provided on a front surface of the planarization layer, and each including a first electrode layer, a light-emitting layer, and a second electrode layer that are provided in this order from the planarization layer;
  a first wiring line provided on a back surface of the planarization layer, and coupled to the first electrode layer through the first opening;
  a second wiring line provided on the back surface of the planarization layer, and coupled to the second electrode layer through the second opening; and
  a sensing wiring line provided in a region and electrically separated from the first electrode layer, the second electrode layer, the first wiring line, and the second wiring line, the region being positioned in the same layer as the first electrode layer, in the same layer as the second wiring line, or in a layer disposed between the first electrode layer and the second wiring line, and being positioned between the first electrode layer and the second opening.

(2) The display panel according to (1), in which the sensing wiring line is provided in the same layer as the first electrode layer, and includes the same material as the first electrode layer.

(3) The display panel according to (1), further including:
  a drive circuit provided on the back surface of the planarization layer and configured to drive the plurality of self-luminous elements; and
  a protection layer that is provided on the back surface of the planarization layer and covers, entirely or partially, the drive circuit, the first wiring line, and the second wiring line,
  in which the sensing wiring line is provided between the protection layer and the planarization layer.

(4) The display panel according to (1), further including:
  a drive circuit provided on the back surface of the planarization layer and configured to drive the plurality of self-luminous elements; and
  a protection layer that is provided on the back surface of the planarization layer and covers, entirely or partially, the drive circuit, the first wiring line, and the second wiring line,
  in which the sensing wiring line is provided in the same layer as the second wiring line.

(5) The display panel according to (4), in which the sensing wiring line includes the same material as the second wiring line.

(6) The display panel according to any one of (1) to (5), in which the sensing wiring line is configured to vary its resistance value on the basis of a corrosion caused by a moisture.

(7) The display panel according to any one of (1) to (6), in which the sensing wiring line includes a metal material containing aluminum.

(8) The display panel according to any one of (1) to (7), in which the sensing wiring line is provided along an outer edge of the display panel.
(9) The display panel according to any one of (1) to (8), in which the second opening surrounds a region that includes the plurality of self-luminous elements, and the second electrode layer includes a portion that covers an inner surface of the second opening.
(10) An electronic apparatus with a display surface that includes a display panel, the display panel including:
a planarization layer having a first opening and a second opening that is provided closer to an end edge of the display panel than the first opening;
a plurality of self-luminous elements provided on a front surface of the planarization layer, and each including a first electrode layer, a light-emitting layer, and a second electrode layer that are provided in this order from the planarization layer;
a first wiring line provided on a back surface of the planarization layer, and coupled to the first electrode layer through the first opening;
a second wiring line provided on the back surface of the planarization layer, and coupled to the second electrode layer through the second opening; and
a sensing wiring line provided in a region and electrically separated from the first electrode layer, the second electrode layer, the first wiring line, and the second wiring line, the region being positioned in the same layer as the first electrode layer, in the same layer as the second wiring line, or in a layer disposed between the first electrode layer and the second wiring line, and being positioned between the first electrode layer and the second opening.

The display panel or the electronic apparatus according to one embodiment of the disclosure includes at least one sensing wiring line provided in the region that is positioned in the same layer as the first electrode layer, in the same layer as the second wiring line, or in a layer disposed between the first electrode layer and the second wiring line, and that is positioned between the first electrode layer and the second opening. Thus, in an example case where an inorganic insulation film that covers the self-luminous elements has a defect such as a crack or a hole and where a moisture has entered from the second opening through the defect of the inorganic insulation film, the moisture is sensed by the at least one sensing wiring line provided closer to the second opening than the self-luminous elements.

In the display panel or the electronic apparatus according to one embodiment of the disclosure, at least one sensing wiring line is provided in the region that is positioned in the same layer as the first electrode layer, in the same layer as the second wiring line, or in a layer disposed between the first electrode layer and the second wiring line, and that is positioned between the first electrode layer and the second opening. Hence, as compared with a case where a sensing wiring line is provided in a structure that is completely different from a structure provided around the self-luminous elements, it is possible to detect, with improved accuracy, a display panel that is likely to cause a display defect attributed to reaching, to the self-luminous element, of the moisture that has entered from the second opening through the defect of the inorganic insulation film. Note that the effects of one embodiment of the disclosure are not necessarily limited to those described herein and may be any effects described herein.

Although the disclosure is described hereinabove in terms of example embodiments and application examples, it is not limited thereto. It should be appreciated that variations may be made in the example embodiments and application examples described herein by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. As used herein, the singular form "a", "an" and "the" include plural references unless the context clearly dictates otherwise. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A display panel comprising:
a planarization layer having a first opening and a second opening that is provided closer to an end edge of the display panel than the first opening;
a plurality of self-luminous elements provided on a front surface of the planarization layer, and each including a first electrode layer, a light-emitting layer, and a second electrode layer that are provided in this order from the planarization layer;
a first wiring line provided on a back surface of the planarization layer, and coupled to the first electrode layer through the first opening;
a second wiring line provided on the back surface of the planarization layer, and coupled to the second electrode layer through the second opening; and
a sensing wiring line provided in a region and electrically separated from the first electrode layer, the second electrode layer, the first wiring line, and the second wiring line, the region being positioned in a same layer as the first electrode layer, in a same layer as the second wiring line, or in a layer disposed between the first electrode layer and the second wiring line, and being positioned between the first electrode layer and the second opening.

2. The display panel according to claim 1, wherein the sensing wiring line is provided in the same layer as the first electrode layer, and includes a same material as the first electrode layer.

3. The display panel according to claim 1, further comprising:
a drive circuit provided on the back surface of the planarization layer and configured to drive the plurality of self-luminous elements; and
a protection layer that is provided on the back surface of the planarization layer and covers, entirely or partially, the drive circuit, the first wiring line, and the second wiring line,
wherein the sensing wiring line is provided between the protection layer and the planarization layer.

4. The display panel according to claim 1, further comprising:
a drive circuit provided on the back surface of the planarization layer and configured to drive the plurality of self-luminous elements; and a protection layer that is provided on the back surface of the planarization layer and covers, entirely or partially, the drive circuit, the first wiring line, and the second wiring line, wherein the sensing wiring line is provided in the same layer as the second wiring line.

5. The display panel according to claim 4, wherein the sensing wiring line includes a same material as the second wiring line.

6. The display panel according to claim 1, wherein the sensing wiring line is configured to vary its resistance value on a basis of a corrosion caused by a moisture.

7. The display panel according to claim 1, wherein the sensing wiring line includes a metal material containing aluminum.

8. The display panel according to claim 1, wherein the sensing wiring line is provided along an outer edge of the display panel.

9. The display panel according to claim 1, wherein the second opening surrounds a region that includes the plurality of self-luminous elements, and the second electrode layer includes a portion that covers an inner surface of the second opening.

10. An electronic apparatus with a display surface that includes a display panel, the display panel comprising:

a planarization layer having a first opening and a second opening that is provided closer to an end edge of the display panel than the first opening;

a plurality of self-luminous elements provided on a front surface of the planarization layer, and each including a first electrode layer, a light-emitting layer, and a second electrode layer that are provided in this order from the planarization layer;

a first wiring line provided on a back surface of the planarization layer, and coupled to the first electrode layer through the first opening;

a second wiring line provided on the back surface of the planarization layer, and coupled to the second electrode layer through the second opening; and a sensing wiring line provided in a region and electrically separated from the first electrode layer, the second electrode layer, the first wiring line, and the second wiring line, the region being positioned in a same layer as the first electrode layer, in a same layer as the second wiring line, or in a layer disposed between the first electrode layer and the second wiring line, and being positioned between the first electrode layer and the second opening.

* * * * *